(12) United States Patent
Briere

(10) Patent No.: US 9,041,067 B2
(45) Date of Patent: May 26, 2015

(54) INTEGRATED HALF-BRIDGE CIRCUIT WITH LOW SIDE AND HIGH SIDE COMPOSITE SWITCHES

(71) Applicant: International Rectifier Corporation, El Segundo, CA (US)

(72) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 14/168,926

(22) Filed: Jan. 30, 2014

(65) Prior Publication Data

US 2014/0225162 A1  Aug. 14, 2014

Related U.S. Application Data

(60) Provisional application No. 61/763,115, filed on Feb. 11, 2013.

(51) Int. Cl.
- *H01L 29/72* (2006.01)
- *H01L 27/06* (2006.01)
- *H01L 21/8252* (2006.01)

(Continued)

(52) U.S. Cl.
CPC ........ *H01L 27/0623* (2013.01); *H01L 21/8252* (2013.01); *H01L 27/0605* (2013.01); *H01L 27/0688* (2013.01); *H01L 27/0694* (2013.01); *H01L 27/085* (2013.01); *H01L 27/0883* (2013.01); *H02M 3/337* (2013.01); *H01L 2224/48091* (2013.01); *H01L 2224/48145* (2013.01); *H01L 2924/13091* (2013.01)

(58) Field of Classification Search
CPC .................................................. H01L 27/0623
USPC ......................................................... 257/195
See application file for complete search history.

(56) References Cited

U.S. PATENT DOCUMENTS

| 6,624,522 B2 | 9/2003 | Standing |
| 7,915,645 B2 | 3/2011 | Briere |

(Continued)

FOREIGN PATENT DOCUMENTS

| JP | 2006-351691 | 12/2006 |
| JP | 2011-49741 | 3/2011 |

OTHER PUBLICATIONS

U.S. Appl. No. 61/448,347, filed Mar. 2, 2011, Lin.

(Continued)

*Primary Examiner* — Edward Wojciechowicz
(74) *Attorney, Agent, or Firm* — Farjami & Farjami LLP

(57) ABSTRACT

There are disclosed herein various implementations of an integrated half-bridge circuit with low side and high side composite switches. In one exemplary implementation, such an integrated half-bridge circuit includes a III-N body including first and second III-N field-effect transistors (FETs) monolithically integrated with and situated over a first group IV FET. The integrated half-bridge circuit also includes a second group IV FET stacked over the III-N body. The first group IV FET is cascoded with the first III-N FET to provide one of the low side and the high side composite switches, and the second group IV FET is cascoded with the second III-N FET to provide the other of the low side and the high side composite switches. The first and second III-N FETs are normally ON FETs, and the low side composite switch and the high side composite switch are normally OFF switches

20 Claims, 4 Drawing Sheets

(51) Int. Cl.
*H01L 27/085* (2006.01)
*H02M 3/337* (2006.01)
*H01L 27/088* (2006.01)

(56) References Cited

U.S. PATENT DOCUMENTS

| 8,017,978 | B2 | 9/2011 | Lidow |
| 8,847,408 | B2 | 9/2014 | Lin |
| 8,866,193 | B2 | 10/2014 | Briere |
| 2009/0050939 | A1 | 2/2009 | Briere |
| 2010/0297810 | A1* | 11/2010 | Otremba et al. .............. 438/107 |
| 2011/0210337 | A1 | 9/2011 | Briere |
| 2012/0229176 | A1 | 9/2012 | Briere |
| 2012/0256188 | A1 | 10/2012 | McDonald |
| 2012/0274366 | A1 | 11/2012 | Briere |
| 2014/0035005 | A1 | 2/2014 | Briere |

OTHER PUBLICATIONS

U.S. Appl. No. 61/473,907, filed Apr. 11, 2011, McDonald.
U.S. Appl. No. 61/763,115, filed Feb. 11, 2013, Briere.
U.S. Appl. No. 61/763,115 filed Feb. 11, 2013, Briere.

* cited by examiner

INTEGRATED HALF-BRIDGE CIRCUIT WITH LOW SIDE AND HIGH SIDE COMPOSITE SWITCHES

The present application claims the benefit of and priority to a provisional application entitled "Half-Bridge Circuit with Integrated Cascoded Devices," Ser. No. 61/763,115 filed on Feb. 11, 2013. The disclosure in this pending provisional application is hereby incorporated fully by reference into the present application.

BACKGROUND

I. DEFINITION

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. BACKGROUND ART

In high power and high performance circuit applications, III-N field-effect transistors (FETs), for example III-N heterostructure FETs (HFETs) such as gallium nitride (GaN) based high mobility electron transistors (HEMTs), are often desirable for their high efficiency and high-voltage operation. Moreover, it is often desirable to combine such III-N FETs with other FETs, such as silicon or other group IV FETs, to create high performance composite switches.

In power management applications where normally OFF characteristics of power switches are desirable, a depletion mode (normally ON) III-N FET can be cascoded with an enhancement mode (normally OFF) low-voltage (LV) group IV FET to produce an enhancement mode (normally OFF) composite power switch. Two such normally OFF composite power switches may then be used to implement a half-bridge circuit in which one composite switch functions as a high side switch, and the other composite switch operates as the low side switch. Despite the performance advantages attributable to use of III-N FETs in power applications, however, the half-bridge circuit design described above requires the use of four FETs to implement two composite power switches. Moreover, conventional solutions for implementing such a design typically require a discrete semiconductor die for each of the four FETs, i.e., two III-N dies and two group IV dies, which undesirably increases the space required to implement the half-bridge circuit, as well as increasing its manufacturing costs.

SUMMARY

The present disclosure is directed to an integrated half-bridge circuit with low side and high side composite switches, substantially as shown in and/or described in connection with at least one of the figures, and as set forth more completely in the claims.

DETAILED DESCRIPTION

Figure 1:
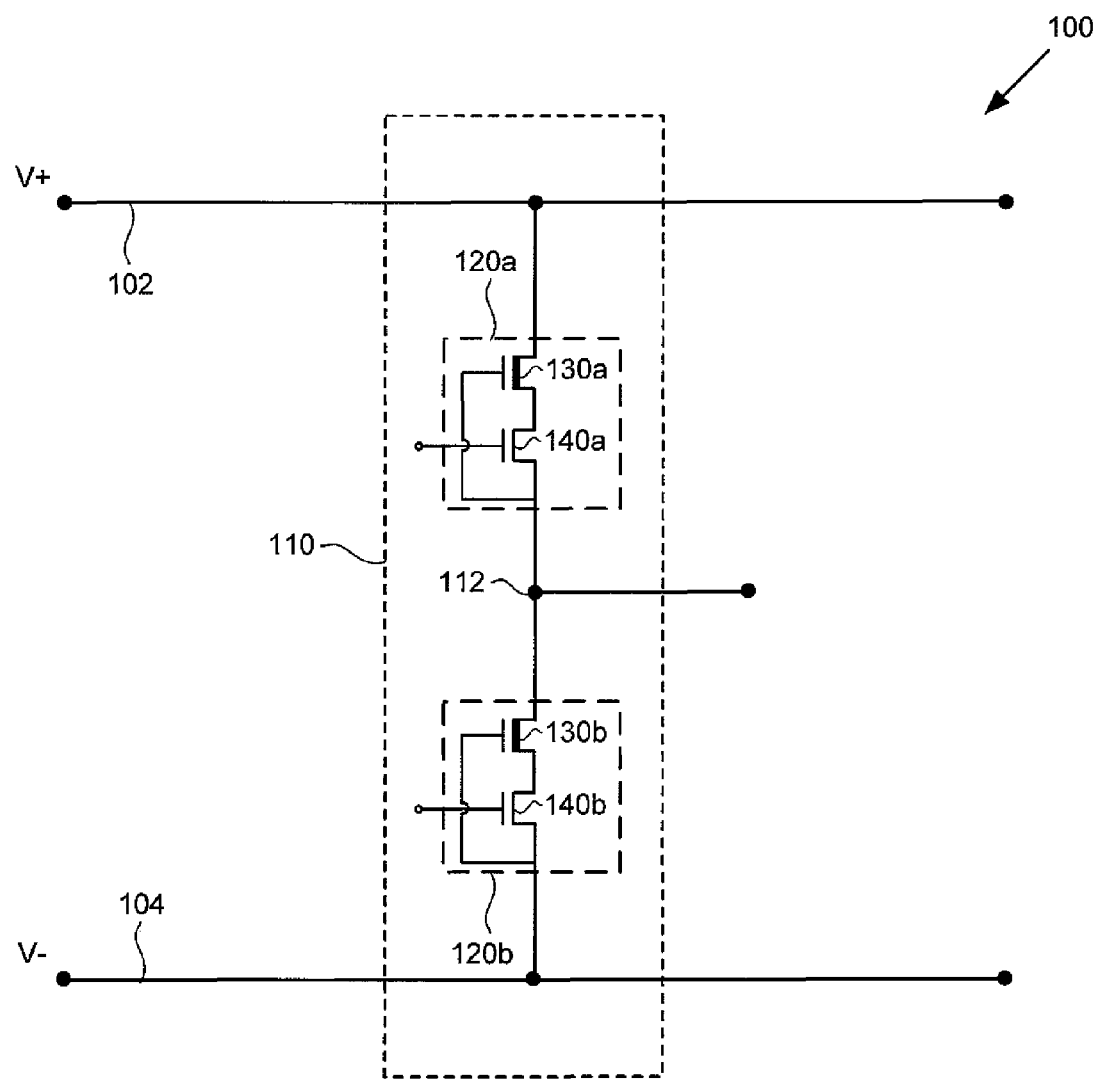
FIG. 1 shows an exemplary integrated half-bridge circuit including low side and high side composite switches.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, in high power and high performance circuit applications, III-N transistors, such as field-effect transistors (FETs) fabricated from III-N materials, are often desirable for their high efficiency and high-voltage handling capability. III-N materials include, for example, gallium nitride (GaN) and its alloys such as aluminum gallium nitride (AlGaN), indium gallium nitride (InGaN), and aluminum indium gallium nitride (AlInGaN). These III-N materials are semiconductor compounds having a relatively wide, direct bandgap and strong piezoelectric polarizations, and can enable high breakdown fields, high saturation velocities, and the creation of two-dimensional electron gases (2DEGs), when formed in certain stacked layer configurations. As a result, III-N materials such as GaN are used in many microelectronic applications as depletion mode (i.e., normally ON) and enhancement mode (i.e., normally OFF) power FETs.

For example, III-N FETs may be used as low side and high side power switches in a half-bridge circuit. A half-bridge circuit is a switch configuration used in power management applications and will be described in greater detail below. Where normally OFF characteristics of the power switches used in the half-bridge circuit may be required, a depletion mode III-N FET can be cascoded with a low-voltage (LV) enhancement mode silicon or other normally OFF FET to produce a normally OFF composite switch. Such a configuration allows for use of the LV FET to control the flow of current through the composite switch, thereby conferring several advantages of the LV Group IV FET to the composite switch. Examples of those advantages include robust and reliable gate drive behavior, and the relatively low gate turn-off current associated with LV silicon or other LV group IV FETs.

An example of such a composite device configuration is disclosed in U.S. Pat. No. 8,017,978, entitled "Hybrid Semiconductor Device," filed Mar. 10, 2006, and issued Sep. 13, 2011. In addition, an example of a half-bridge circuit implemented using composite power switches is disclosed by U.S. patent application Ser. No. 13/454,039, entitled "Integrated Power Stage," and filed on Apr. 23, 2012. The entire disclosures in the above-referenced patent and patent application are hereby incorporated fully by reference into the present application.

Although, as noted above, use of a half-bridge circuit configuration including composite switches is known, effective and efficient integration of the half-bridge circuit as a whole has been lacking in the art. The present application is directed to a more highly integrated half-bridge circuit with low side and high side composite switches. As will be described in greater detail below, implementations of the integration disclosed in the present application include die stacking configurations, as well as monolithic integration of the composite switches.

Referring to FIG. 1, FIG. 1 shows power management circuit 100 including integrated half-bridge circuit 110. In addition to integrated half-bridge circuit 110, power management circuit 100 further includes high voltage rail 102 and low voltage rail 104. Integrated half-bridge circuit 110 includes a low side switch and a high side switch coupled by switch node 112. According to the implementation shown in FIG. 1, the low side switch takes the form of low side composite switch 120b coupled to low voltage rail 104, and the high side switch takes the form of high side composite switch 120a coupled to high voltage rail 102. As noted above and shown in FIG. 1, low side composite switch 120b is coupled to high side composite switch 120a to provide switch node 112. Thus integrated half-bridge circuit 110 including low side composite switch 120b and high side composite switch 120a is coupled between low voltage rail 104 and high voltage rail 102, and provides an output from switch node 112.

As further shown in FIG. 1, low side composite switch 120b of integrated half-bridge circuit 110 includes III-N FET 130b and group IV FET 140b cascoded with III-N FET 130b. In addition, high side composite switch 120a of integrated half-bridge circuit 110 includes III-N FET 130a and group IV FET 140a cascoded with III-N FET 130a. With respect to implementation of composite switches suitable for use as low side composite switch 120b and/or high side composite switch 120a, it is noted that several composite devices are disclosed in U.S. patent application Ser. No. 12/928,103, entitled "Monolithic Integration of Silicon and Group III-V Devices," and filed on Dec. 3, 2010, as well as in U.S. Pat. No. 7,915,645, entitled "Monolithic Vertically Integrated Composite Group III-V and Group IV Semiconductor Device and Method for Fabricating Same," filed on May 28, 2009, and issued on Mar. 29, 2011. The entire disclosures in the above-referenced patent application and patent are hereby incorporated fully by reference into the present application.

Figure 2A:
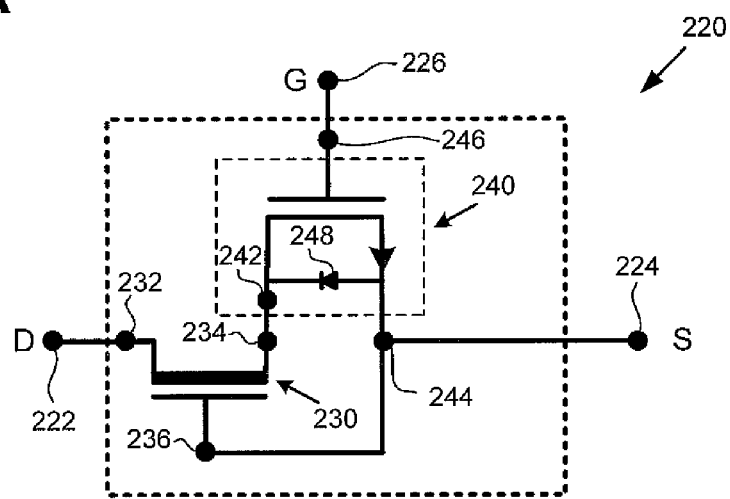
FIG. 2A shows a diagram of an exemplary composite switch.

Referring now to FIG. 2A, FIG. 2A shows a diagram of exemplary composite switch 220 suitable for use as either or both of low side composite switch 120b and high side composite switch 120a, in FIG. 1. As shown in FIG. 2A, composite switch 220 includes III-N FET 230, and group IV FET 240 cascoded with III-N FET 230. Also shown in FIG. 2A are composite source 224, composite drain 222, and composite gate 226 of composite switch 220, as well as source 234, drain 232, and gate 236 of III-N FET 230, and body diode 248, source 244, drain 242, and gate 246 of group IV FET 240.

Group III-V FET 230 may be a normally ON III-N power FET and may be implemented as a depletion mode heterostructure FET (HFET), for example. In one implementation, III-N FET 230 may take the form of a depletion mode high electron mobility transistor (HEMT) configured to incorporate a 2DEG. According to one implementation, for example, III-N FET 230 may be a high-voltage (HV) FET, as defined above in the Definition section. It is noted that in some implementations, III-N FET 230 may be a midvoltage (MV) FET or an LV FET, as also defined above in the Definition section, so long as group IV FET 240 (described below) is selected appropriately.

Group IV FET 240 may be implemented as an LV group IV FET, as defined above in the Definition section. For example, group IV FET 240 may be an LV vertical channel FET, such as a normally OFF silicon trench type vertical channel FET, for example. However, in some implementations, group IV FET 240 may be implemented as a lateral channel, or planar, LV FET. According to one implementation, group IV FET 240 may be a silicon MISFET or MOSFET, for example. However, in other implementations, group IV FET 240 may include any suitable group IV material, such as silicon carbide (SiC), germanium (Ge), silicon germanium (SiGe), or a strained group IV element or compound, for example.

The cascoded combination of III-N FET 230 and group IV FET 240 provides composite switch 220, which according to the implementation shown in FIG. 2A can be configured as a composite three terminal switch functioning in effect as a normally OFF composite FET having composite source 224 and composite gate 226 provided by group IV FET 240, and composite drain 222 provided by III-N FET 230. That is to say, drain 242 of group IV FET 240 is coupled to source 234 of III-N FET 230, source 244 of group IV FET 240 provides composite source 224 for composite switch 220, and gate 246 of group IV FET 240 provides composite gate 226 for composite switch 220. Moreover, drain 232 of III-N FET 230 provides composite drain 222 for composite switch 220, while gate 236 of III-N FET 230 is coupled to source 244 of group IV FET 240.

The operation of composite switch 220 implemented as an enhancement mode (normally OFF) switch formed from normally OFF group IV FET 240 cascoded with depletion mode (normally ON) III-N FET 230 will now be described by reference to specific, but merely exemplary, parameters. For example, as voltage is increased at composite drain 222 of composite switch 220 while III-N FET 230 is ON, a few volts (e.g., approximately 10 V) will develop across reverse biased body diode 248 of group IV FET 240. This voltage is inverted and applied to gate 236 of III-N FET 230 (e.g., as an approximately −10 V gate voltage). In response, III-N FET 230 will turn OFF (e.g., assuming a pinch-off voltage magnitude of approximately 10 V) and any additional increase in the drain voltage at composite drain 222 will be sustained across drain 232 and source 234 of III-N FET 230. Thus, group IV FET 240 including body diode 248 will typically not be required to sustain a voltage beyond the first few volts (e.g., approximately 10 V) applied to composite drain 222.

Figure 2B:
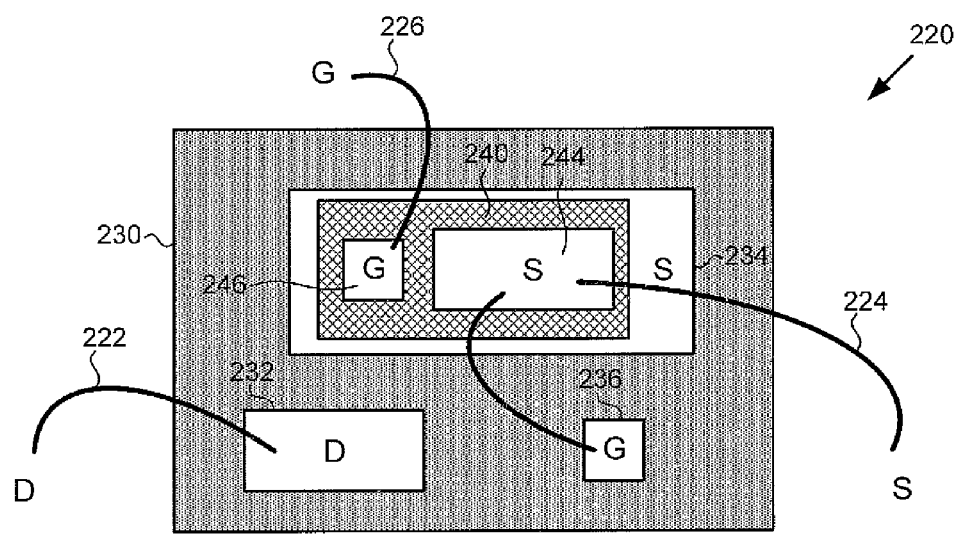
FIG. 2B shows a structure capable of implementing the exemplary composite switch of FIG. 2A.

FIG. 2B shows a structure capable of implementing the exemplary composite switch of FIG. 2A. FIG. 2B is an example of use of vertical integration to stack group IV FET 240 on top of III-N FET 230 to form composite switch 220. Such an approach to vertical integration of a composite switch is disclosed in U.S. patent application Ser. No. 13/053,556, entitled "III-Nitride Transistor Stacked with FET in a Package," and filed on Mar. 22, 2011. The entire disclosure in this patent application is hereby incorporated fully by reference into the present application.

Referring to FIG. 2B, composite switch 220 in FIG. 2B corresponds in general to composite switch 220 in FIG. 2A. According to the exemplary implementation shown in FIG. 2B, group IV FET 240 is a vertical channel FET having source 244 and gate 246 on a front or top side, and a drain on a back or bottom side of group IV FET 240 (drain of group IV FET 240 not visible in FIG. 2B). As shown in FIG. 2B, vertical integration of group IV FET 240 and III-N FET 230 may be achieved by stacking the drain of group IV FET 240 on the back or bottom side of group IV FET 240 (not shown in FIG. 2B) directly on source 234 of III-N FET 230. Also shown in FIG. 2B are drain 232 and gate 236 of III-N FET 230, and composite source 224, composite drain 222, and composite gate 226 of composite switch 220.

Although vertical integration is achieved in the exemplary implementation of FIG. 2B by stacking group IV FET 240 on III-N FET 230, in other implementations it may be advantageous or desirable to stack III-N FET 230 on group IV FET 240. Several examples of stacked composite devices configured in such manner are disclosed in U.S. patent application Ser. No. 13/433,864, entitled "Stacked Composite Device Including a Group III-V Transistor and a Group IV Lateral Transistor," filed on Mar. 29, 2012, and claiming priority to provisional patent application Ser. No. 61/473,907, entitled "Group III-Nitride and Group IV Composite Device," filed Apr. 11, 2011. The entire disclosures in these patent applications are hereby incorporated fully by reference into the present application.

Figure 3:
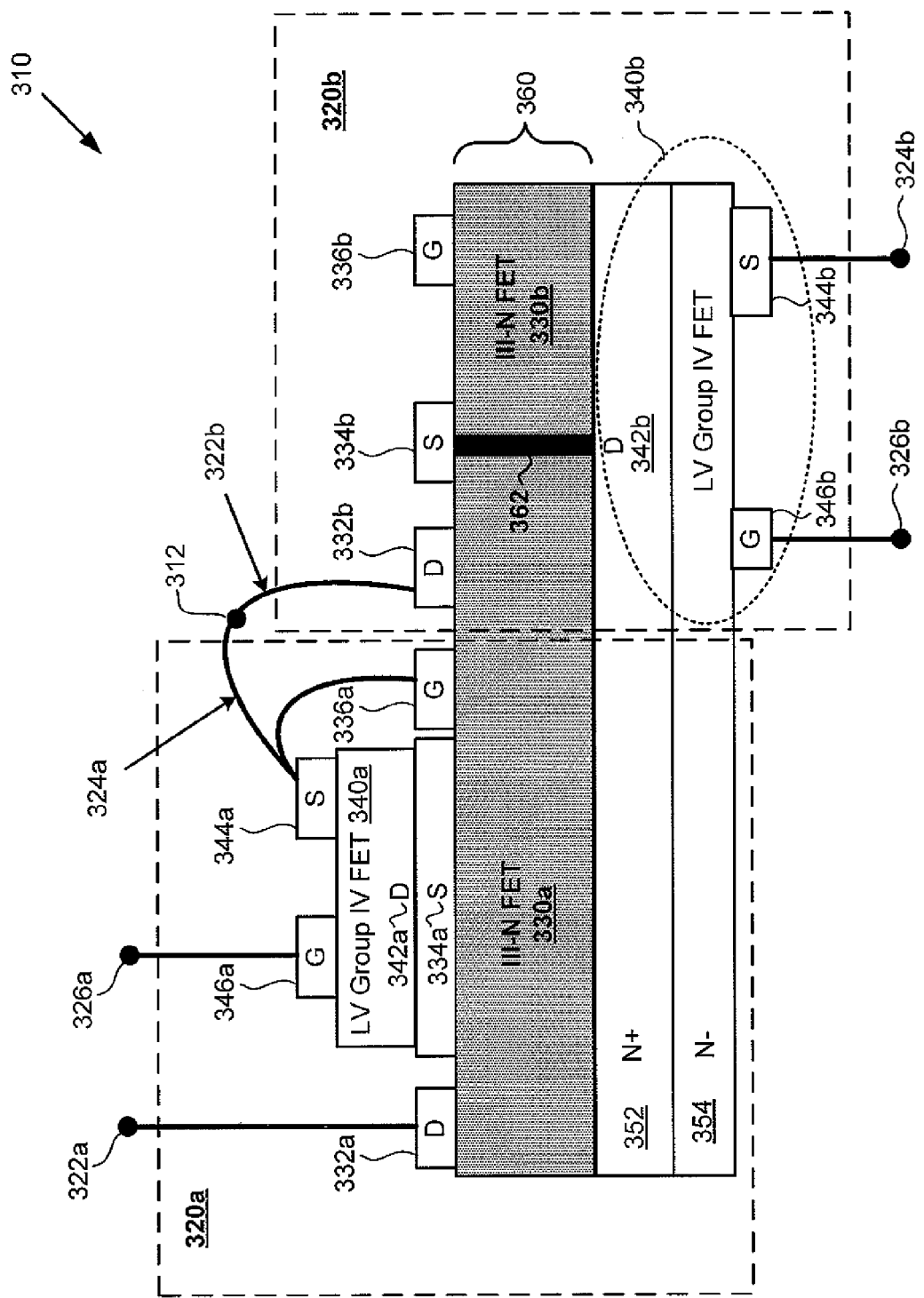
FIG. 3 shows an integrated half-bridge circuit with low side and high side composite switches, according to one implementation.

Referring now to FIG. 3, FIG. 3 shows integrated half-bridge circuit 310 with respective low side and high side composite switches 320b and 320a, according to one implementation. As shown in FIG. 3, integrated half-bridge circuit 310 includes III-N body 360 including HV III-N FETs 330b and 330a monolithically integrated with and situated over LV group IV FET 340b, which is shown to be fabricated in group IV layers 352 and 354. As further shown in FIG. 3, integrated half-bridge circuit 310 also includes LV group IV FET 340a stacked over III-N body 360.

LV group IV FET 340b is cascoded with HV III-N FET 330b to provide low side composite switch 320b. In other words, drain 342b of LV group IV FET 340b is coupled to source 334b of HV III-N FET 330b, for example, by through-semiconductor via (TSV) 362 through III-N body 360. In addition, source 344b of LV group IV FET 340b provides composite source 324b for low side composite switch 320b, and gate 346b of LV group IV FET 340b provides composite gate 326b for low side composite switch 320b. Moreover, drain 332b of HV III-N FET 330b provides composite drain 322b for low side composite switch 320b.

Although not explicitly shown in FIG. 3, gate 336b of HV III-N FET 330b may be coupled to source 344b of LV group IV FET 340b using any of several techniques. For example, gate 336b of HV III-N FET 330b may be coupled to source 344b of LV group IV FET 340b through use of a TSV, one or more bond wires, such as gold (Au) or copper (Cu) bond wires, for example, or by conductive ribbons, clips, or other connectors formed of conductive materials such as Al, Au, Cu, and/or other metals or composite materials. Alternatively, connection can be made through vias and patterned interconnects formed on one or more planarized insulating layers. Several examples of composite devices configured in such a manner are disclosed in U.S. patent application Ser. No. 12/174,329, entitled "III-Nitride Device," filed on Jul. 16, 2008, and U.S. patent application Ser. No. 13/472,756, entitled "Integrated Semiconductor Device," filed on May 16, 2012. The entire disclosures in these patent applications are hereby incorporated fully by reference into the present application.

As shown in FIG. 3, LV group IV FET 340b may be a vertical channel group IV FET having source 344b and gate 346b formed at a surface of N− group IV layer 354 serving as a drift region for LV group IV FET 340b. As further shown in FIG. 3, N+ group IV layer 352 is situated between N− group IV layer 354 and III-N body 360, and may provide drain 342b of LV group IV FET 340b. In some implementations, as shown in FIG. 3, TSV 362 may extend through III-N body 360 to, but not into, N+ group IV layer 352. However, in other implementations, TSV 362 may extend through some or all of N+ group IV layer 352 as well.

It is noted that although LV group IV FET 340b is described as a vertical channel FET in the exemplary implementation shown in FIG. 3, in other implementations, LV group IV FET 340b may be formed as a lateral channel FET. Several examples of monolithically integrated III-N FETs and LV group IV FETs are disclosed in U.S. Pat. No. 7,915,645, entitled "Monolithic Vertically Integrated Composite Group III-V and Group IV Semiconductor Device and Method for Fabricating Same," filed on May 28, 2009, and U.S. patent application Ser. No. 14/049,564, entitled "Monolithic Integrated Group III-V and Group IV Device," filed on Oct. 9, 2013. The entire disclosures in this patent and patent application are hereby incorporated fully by reference into the present application.

Referring to high side composite switch 320a, as shown in FIG. 3, LV group IV FET 340a is cascoded with HV III-N FET 330a to provide high side composite switch 320a. In other words, drain 342a of LV group IV FET 340a is coupled to source 334a of HV III-N FET 330a, source 344a of LV group IV FET 340a provides composite source 324a for high side composite switch 320a, and gate 346a of LV group IV FET 340a provides composite gate 326a for high side composite switch 320a. Moreover, drain 332a of HV III-N FET 330a provides composite drain 322a for high side composite switch 320a, while gate 336a of HV III-N FET 330a is coupled to source 344a of LV group IV FET 340a. As further shown in FIG. 3, composite source 324a of high side composite switch 320a is coupled to composite drain 322b of low side composite switch 320b to provide switch node 312 of integrated half-bridge circuit 310.

Integrated half-bridge circuit 310 corresponds in general to integrated half-bridge circuit 110, in FIG. 1. That is to say, low side composite switch 320b including LV group IV FET 340b cascoded with HV III-N FET 330b, and high side composite switch 320a including LV group IV FET 340a cascoded with HV III-N FET 330a correspond respectively, in general, to low side composite switch 120b including group IV FET 140b cascoded with III-N FET 130b, and high side composite switch 120a including group IV FET 140a cascoded with III-N FET 130a. Moreover, switch node 312, in FIG. 3, corresponds in general to switch node 112, in FIG. 1.

In addition, low side composite switch 320b including LV group IV FET 340b cascoded with HV III-N FET 330b, and high side composite switch 320a including LV group IV FET 340a cascoded with HV III-N FET 330a, in FIG. 3, correspond to composite switch 220 including group IV FET 240 cascoded with III-N FET 230, in FIG. 2. Thus, LV group IV FETs 340a and 340b, in FIG. 3, correspond to group IV FET 240, in FIG. 2, while HV III-N FETs 330a and 330b correspond to III-N FET 230, and may share any of the characteristics attributed to those corresponding features, above.

As shown in FIG. 3, one or both of LV group IV FETs 340a and 340b may be implemented as vertical group IV FETs. For example, LV group IV FET 340a may be a vertical group IV FET having drain 342a on a back or bottom side of LV group IV FET 340a stacked on source 334a of HV III-N FET 330a. Stacking of LV group IV FET 340a on top of HV III-N FET 330a may be achieved using, for example, solder, conductive adhesive, conductive tape, sintering, or other attachment methods, resulting in formation of a direct mechanical and electrical contact between LV group IV FET 340a and HV III-N FET 330a. Another example of direct stacking of a vertical LV group IV FET onto a HV III-N FET is disclosed in U.S. patent application Ser. No. 13/053,556, entitled "III-Nitride Transistor Stacked with FET in a Package," filed on Mar. 22, 2011 and claiming priority to provisional patent application Ser. No. 61/448,347, entitled "III-Nitride Transistor Stacked with FET in a Package," filed Mar. 2, 2011. The entire disclosures in these patent applications are hereby incorporated fully by reference into the present application.

Direct attachment, for example through stacking, of LV group IV FET 340a over the monolithically integrated combination of LV group IV FET 340b with HV III-N FETs 330a and 330b can advantageously reduce parasitic inductance and resistance, improve thermal dissipation, and reduce form factor and manufacturing costs for integrated half-bridge circuit 310 compared to conventional half-bridge circuit designs using discrete switches.

It is noted that although LV group IV FET 340a is described as a vertical channel FET in the exemplary implementation shown in FIG. 3, in other implementations, LV group IV FET 340a may be formed as a lateral channel FET. Furthermore, LV group IV FET 340a may also be monolithically integrated using the same substrate as the III-N FETs Examples of monolithic integration of LV group IV FET 340a and HV III-Nitride FET 330a including the via connections between the two devices are described in U.S. Pat. No. 7,915,645 and U.S. patent application Ser. No. 12/174,329, both of which are referenced above and have their entire disclosures incorporated fully by reference into the present application.

It is further noted that although composite switch 320a is described as the high side composite switch in the implementation of integrated half-bridge circuit 310 shown in FIG. 3, and composite switch 320b is described as the low side composite switch, those representations are merely exemplary. In other implementations, composite switch 320b may be implemented as the high side composite switch, and composite switch 320a may function as the low side composite switch of integrated half-bridge circuit 310. It is further noted that in those implementations, composite source 324b of composite switch 320b would be coupled to composite drain 322a of composite switch 320a to provide switch node 312 of integrated half-bridge circuit 310.

Figure 4:
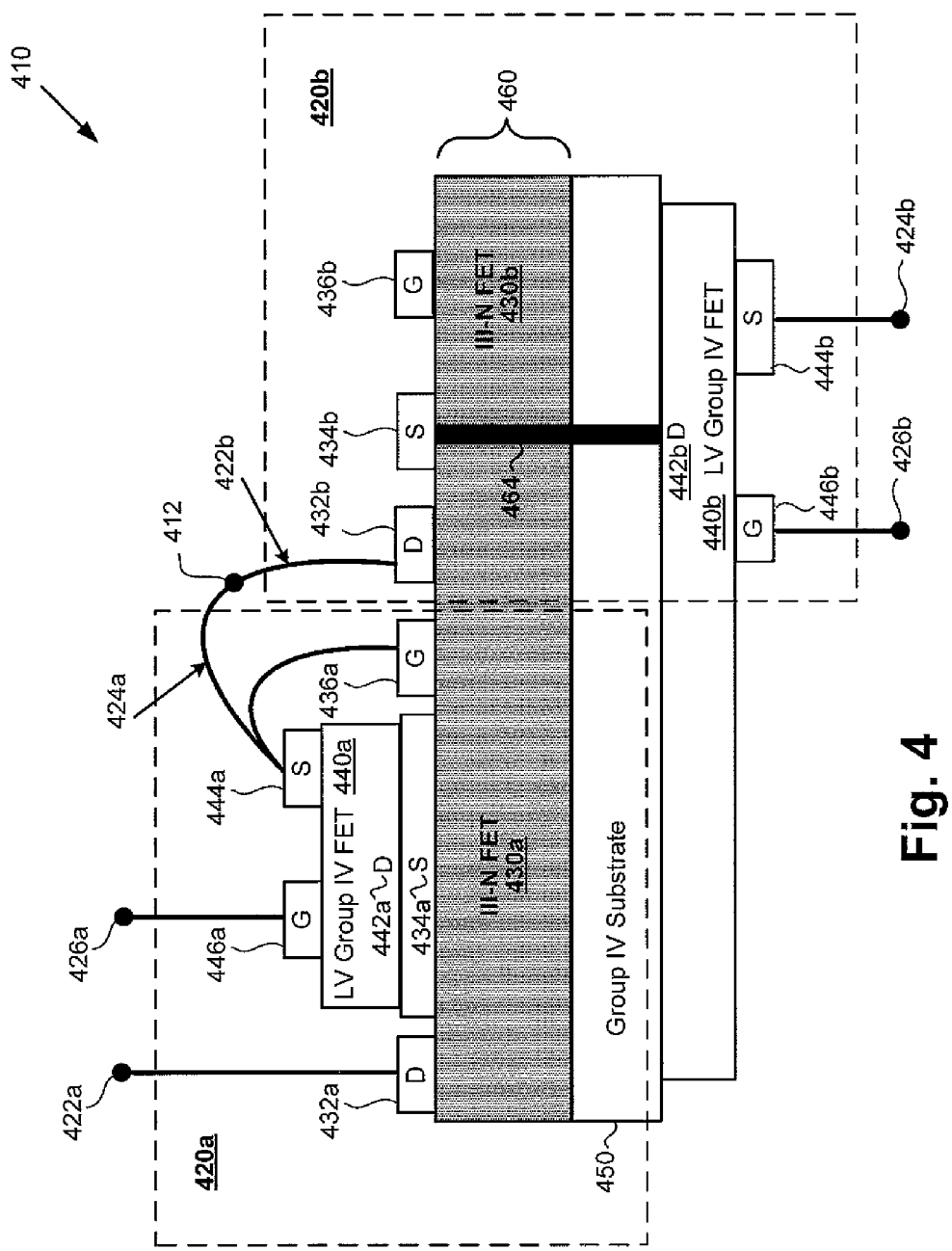
FIG. 4 shows an integrated half-bridge circuit with low side and high side composite switches, according to another implementation.

Continuing to FIG. 4, FIG. 4 shows integrated half-bridge circuit 410 with respective low side and high side composite switches 420b and 420a, according to another implementation. As shown in FIG. 4, integrated half-bridge circuit 410 includes LV group IV FET 440b stacked under group IV substrate 450. In addition, integrated half-bridge circuit 410 includes III-N body 460 including HV FETs 430b and 430a situated over group IV substrate 450. As further shown in FIG. 4, integrated half-bridge circuit 410 also includes LV group IV FET 440a stacked over III-N body 460.

LV group IV FET 440b is cascoded with HV III-N FET 430b to provide low side composite switch 420b. In other words, drain 442b of LV group IV FET 440b is coupled to source 434b of HV III-N FET 430b, for example, by TSV 464 through III-N body 460. In addition, source 444b of LV group IV FET 440b provides composite source 424b for low side composite switch 420b, and gate 446b of LV group IV FET 440b provides composite gate 426b for low side composite switch 420b. Moreover, drain 432b of HV III-N FET 430b provides composite drain 422b for low side composite switch 420b. Although not explicitly shown in FIG. 4, gate 436b of HV III-N FET 430b may be coupled to source 444b of LV group IV FET 440b using any of several techniques. For example, gate 436b of HV III-FET 430b may be coupled to source 444b of LV group IV FET 440b through use of a TSV, one or more bond wires, such as Au or Cu bond wires, for example, or by conductive ribbons, clips, or other connectors formed of conductive materials such as Al, Au, Cu, and/or other metals or composite materials. Alternatively, connections can be made external to the semiconductor device construction, for example in the semiconductor package or a printed circuit board (PCB) serving as a mounting surface for the semiconductor package, provided that such connections exhibit sufficiently low parasitic resistance and inductance.

As shown in FIG. 4, LV group IV FET 440b may be a vertical group IV FET. In some implementations, as shown in FIG. 4, TSV 464 may extend through III-N body 460 and through group IV substrate 450 to contact drain 442b of LV group IV FET 440b. However, in other implementations, group IV substrate 450 may be a conductive substrate, and TSV 464 may extend through III-N body to, or into, but not through, group IV substrate 450. In some implementations, LV group IV FET 440b may take the form of a DirectFET® or other flip chip, or may be implemented as a direct-mount chip scale FET package that is inverted such that III-N body 460 is attached to the drain side of packaged LV group IV FET 440b. Examples of chip scale packaging are disclosed in U.S. Pat. No. 6,624,522, entitled "Chip Scale Surface Mounted Device and Process of Manufacture," filed on Mar. 28, 2001, and issued on Sep. 23, 2003. The entire disclosure in this patent is hereby incorporated fully by reference into the present application.

Referring to high side composite switch 420a, as shown in FIG. 4, LV group IV FET 440a is cascoded with HV III-N FET 430a to provide high side composite switch 420a. In other words, drain 442a of LV group IV FET 440a is coupled to source 434a of HV III-N FET 430a, source 444a of LV group IV FET 440a provides composite source 424a for high side composite switch 420a, and gate 446a of LV group IV FET 440a provides composite gate 426a for high side composite switch 420a. Moreover, drain 432a of HV III-N FET 430a provides composite drain 422a for high side composite switch 420a, while gate 436a of HV III-N FET 430a is coupled to source 444a of LV group IV FET 440a. As further shown in FIG. 4, composite source 424a of high side composite switch 420a is coupled to composite drain 422b of low side switch 420b to provide switch node 412 of integrated half-bridge circuit 410.

Integrated half-bridge circuit 410 corresponds in general to integrated half-bridge circuit 110, in FIG. 1. That is to say, low side composite switch 420b including LV group IV FET 440b cascoded with HV III-N FET 430b, and high side composite switch 420a including LV group IV FET 440a cascoded with HV III-N FET 430a correspond respectively, in general, to low side composite switch 120b including group IV FET 140b cascoded with III-N FET 130b, and high side composite switch 120a including group IV FET 140a cascoded with III-N FET 130a. Moreover, switch node 412, in FIG. 4, corresponds in general to switch node 112, in FIG. 1.

In addition, low side composite switch 420b including LV group IV FET 440b cascoded with HV III-N FET 430b, and high side composite switch 420a including LV group IV FET 440a cascoded with HV FET 430a, in FIG. 4, correspond to composite switch 220 including group IV FET 240 cascoded with III-N FET 230, in FIG. 2. Thus, LV group IV FETs 440a and 440b, in FIG. 4, correspond to group IV FET 240, in FIG. 2, while HV III-N FETs 430a and 430b correspond to III-N FET 230, and may share any of the characteristics attributed to those corresponding features, above.

As shown in FIG. 4, one or both of LV group IV FETs 440a and 440b may be implemented as vertical group IV FETs. For example, LV group IV FET 440a may be a vertical group IV FET having drain 442a on a back or bottom side of LV group IV FET 440a stacked on source 434a of HV III-N FET 430a. Stacking of LV group IV FET 440a on top of HV III-N FET 430a may be achieved using, for example, solder, conductive adhesive, conductive tape, sintering, or other attachment methods, resulting in formation of a direct mechanical contact between LV group IV FET 440a and HV III-N FET 430a.

It is noted that although composite switch 420a is described as the high side composite switch in the implementation of integrated half-bridge circuit 410 shown in FIG. 4, and composite switch 420b is described as the low side composite switch, those representations are merely exemplary. In other implementations, composite switch 420b may be implemented as the high side composite switch, and composite switch 420a may function as the low side composite switch of integrated half-bridge circuit 410. It is further noted that in those implementations, composite source 424b of composite switch 420b would be coupled to composite drain 422a of composite switch 420a to provide switch node 412 of integrated half-bridge circuit 410.

Thus, the present application discloses an integrated half-bridge circuit including low side and high side composite switches. By stacking and monolithically integrating various configurations including group IV FETs cascoded with III-N FETs, the present application discloses solutions resulting in a highly integrated half-bridge circuit. Consequently, various implementations of the present solution can advantageously reduce parasitic inductance and resistance, improve thermal dissipation, and reduce form factor and manufacturing costs compared to conventional half-bridge circuit designs.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An integrated half-bridge circuit including a low side composite switch and a high side composite switch, said integrated half-bridge circuit comprising:
   a III-N body including first and second III-N field-effect transistors (FETs) monolithically integrated with and situated over a first group IV FET;
   a second group IV FET stacked over said III-N body;
   said first group IV FET cascoded with said first III-N FET to provide one of said low side and said high side composite switches, and said second group IV FET cascoded with said second III-N FET to provide the other of said low side and said high side composite switches;
   wherein said first and second III-N FETs are normally ON FETs, and wherein said low side composite switch and said high side composite switch are normally OFF switches.

2. The integrated half-bridge circuit of claim 1, wherein a source of said first III-N FET is coupled to a drain of said first group IV FET by a through-semiconductor via (TSV) through said III-N body.

3. The integrated half-bridge circuit of claim 1, wherein a drain of said second group IV FET on a bottom side of said second group IV FET is stacked on a source of said second III-N FET.

4. The integrated half-bridge circuit of claim 1, wherein said first group IV FET, said second group IV FET, and said first and second III-N FETs are monolithically integrated.

5. The integrated half-bridge circuit of claim 1, wherein at least one of said first and second group IV FETs comprises a lateral channel FET.

6. The integrated half-bridge circuit of claim 1, wherein at least one of said first and second group IV FETs comprises a vertical channel FET.

7. The integrated half-bridge circuit of claim 1, wherein said first and second group IV FETs comprise low-voltage silicon FETs.

8. The integrated half-bridge circuit of claim 1, wherein said first and second III-N FETs comprise high-voltage III-N FETs.

9. The integrated half-bridge circuit of claim 1, wherein said first and second III-N FETs comprise III-N high electron mobility transistors (HEMTs).

10. An integrated half-bridge circuit including a low side composite switch and a high side composite switch, said integrated half-bridge circuit comprising:
    a first group IV field-effect transistor (FET) stacked under a substrate;
    a III-N body including first and second III-N FETs situated over said substrate;
    a second group IV FET stacked over said III-N body;
    said first group IV FET cascoded with said first III-N FET to provide one of said low side and said high side composite switches, and said second group IV FET cascoded with said second III-N FET to provide the other of said low side and said high side composite switches;

wherein said first and second III-N FETs are normally ON FETs, and wherein said low side composite switch and said high side composite switch are normally OFF switches.

11. The integrated half-bridge circuit of claim 10, wherein said first III-N FET is coupled to said first group IV FET by a through-semiconductor via (TSV).

12. The integrated half-bridge circuit of claim 10, wherein said TSV extends through said substrate and contacts a drain of said first group IV FET.

13. The integrated half-bridge circuit of claim 10, wherein a drain of said second group IV FET on a bottom side of said second group IV FET is stacked on a source of said second III-N FET.

14. The integrated half-bridge circuit of claim 10, wherein said first and second III-N FETs are monolithically integrated.

15. The integrated half-bridge circuit of claim 10, wherein said first and second group IV FETs comprise silicon FETs.

16. The integrated half-bridge circuit of claim 10, wherein said first and second group IV FETs comprise low-voltage group IV FETs, and wherein said first and second III-N FETs comprise high-voltage III-N FETs.

17. The integrated half-bridge circuit of claim 10, wherein said first and second III-N FETs comprise III-N high electron mobility transistors (HEMTs).

18. The integrated half-bridge circuit of claim 10, wherein said first and second III-N FETs and one of said first and second group IV FETs are monolithically integrated.

19. The integrated half-bridge circuit of claim 10, wherein at least one of said first and second group IV FETs comprises a lateral channel FET.

20. The integrated half-bridge circuit of claim 10, wherein at least one of said first and second group IV FETs comprises a vertical channel FET.

* * * * *